(12) United States Patent
Hung

(10) Patent No.: US 7,732,828 B2
(45) Date of Patent: Jun. 8, 2010

(54) FLAT PANEL DISPLAY

(75) Inventor: Chen-Pin Hung, Tainan (TW)

(73) Assignee: Chimei-InnoLux Corporation (TW)

( * ) Notice: Subject to any disclaimer, the term of this patent is extended or adjusted under 35 U.S.C. 154(b) by 221 days.

(21) Appl. No.: 12/044,631

(22) Filed: Mar. 7, 2008

(65) Prior Publication Data

US 2008/0175021 A1 Jul. 24, 2008

Related U.S. Application Data

(62) Division of application No. 11/153,889, filed on Jun. 14, 2005, now Pat. No. 7,365,370.

(30) Foreign Application Priority Data

Jun. 18, 2004 (TW) ............................... 93117821 A

(51) Int. Cl.
*H01L 33/00* (2010.01)

(52) U.S. Cl. ............................. 257/98; 257/59; 257/82; 257/88; 257/E31.053

(58) Field of Classification Search ................... 257/59, 257/82, 88, 98
See application file for complete search history.

(56) References Cited

U.S. PATENT DOCUMENTS

| 6,379,016 | B1 * | 4/2002 | Boyd et al. ................. 362/625 |
| 6,598,998 | B2 | 7/2003 | West et al. |
| 6,891,677 | B2 * | 5/2005 | Nilsen et al. ................. 359/625 |
| 6,987,613 | B2 | 1/2006 | Pocius et al. |
| 2003/0067760 | A1 * | 4/2003 | Jagt et al. ..................... 362/31 |
| 2004/0004826 | A1 | 1/2004 | Wakaki et al. |
| 2005/0212089 | A1 | 9/2005 | Kiyomoto et al. |

FOREIGN PATENT DOCUMENTS

| CN | 1402884 A | 3/2003 |
| CN | 1462422 A | 12/2003 |

* cited by examiner

*Primary Examiner*—Wai-Sing Louie
(74) *Attorney, Agent, or Firm*—Townsend and Townsend and Crew LLP

(57) ABSTRACT

A flat panel display is provided. The flat panel display includes a display panel. A light guide plate is disposed below the display panel. At least one optical film is disposed between the display panel and the light guide plate. At least one illuminating device package is disposed in proximity to the side of the light guide plate. The illuminating device package includes an illuminating semiconductor device and a lens encapsulating the illuminating semiconductor device. The lens includes two reflective surfaces disposed at either side of a central axis. A plurality of diffractive surfaces are disposed between the reflective surfaces. Each of the diffractive surfaces has a tilt angle respective to the central axis. A first portion of light beams incident to each of the reflective surfaces is reflected to at least one diffractive surface and then diffracted and collected into a first convergent angle.

18 Claims, 6 Drawing Sheets

FLAT PANEL DISPLAY

CROSS-REFERENCE TO RELATED APPLICATION

The present application is a division of U.S. application Ser. No. 11/153,889, filed on Jun. 14, 2005, entitled "Light Emitting Diode Package," which claims priority to Taiwanese Patent Application No. 93117821, filed Jun. 18, 2004, the contents of both applications are incorporated herein by reference in their entirety.

BACKGROUND OF THE INVENTION

1. Field of the Invention

The present invention relates to a flat panel display, and more particularly, to a flat panel display including a side illuminating light emitting diode package having a small degree divergent angle.

2. Description of the Prior Art

In recent years, display technologies have advanced significantly, and after continuous research and development, products including liquid crystal displays (LCDs), plasma displays, and organic light emitting diode displays of various sizes have been widely utilized in various industries. Essentially, the direction of development of the display industry has been moving toward a direction of high brightness and high yield to manufacture more valuable and cost-effective products for the industry. Of all critical components of a display, the backlight module utilized for providing the light source has been recognized as one of the most important parts for determining the effectiveness of the product. Hence, a well-designed backlight module is able to effectively increase the brightness of the display and also expand the flexibility of other components during the fabrication process, whereas a poorly designed backlight module will not only provide a limited brightness but also influence the performance of the display.

Typically, the backlight module is divided into two categories: edge light and direct-underlying. However, backlight modules utilizing light emitting diode as the light source have also become increasingly popular. Essentially, a backlight module combined with light emitting diodes is able to provide advantages including high luminosity, high detail, and high coloration, without the use of mercury. Consequently, the backlight module can be applied in numerous fields including cars, displays, televisions, and portable electronic products, and when a light emitting diode is utilized as a light source, the illumination direction of the light emitting diode has to be carefully manipulated to generate an effective light source for increasing the overall brightness of the display product.

FIG. 1 is a perspective diagram showing a conventional light emitting diode package 10. As shown in FIG. 1, the light emitting diode package 10 includes a packaging substrate 12 and a light emitting diode chip 14. In general, the flow of an electrical current through the PN junction of the light emitting diode chip 14 will facilitate electrons to combine with electron holes to produce light. Since light is projected in different directions, most of the light will be collected into a ±60° divergent angle. Nevertheless, when the light emitting diode package 10 is applied to the side of a light device, the illumination intensity produced by the divergent angle 16 will become unsatisfactory.

FIG. 2 is a perspective diagram showing another conventional light emitting diode package 30. As shown in FIG. 2, the light emitting diode package 30 includes a hemispherical lens 32. When light is projected from the light emitting diode package 30, the field of illumination 34 produced will travel along the axis 36 of the light emitting diode package 30 as a result of the influence of the hemispherical lens 32. Most of the light produced by the light emitting diode package 30 is projected upward, whereas a small portion of the light is projected away from the two sides of the light emitting diode package 30.

FIG. 3 is a perspective diagram showing the light emitting diode package 30 from FIG. 2 disposed on the sideline of a light guide plate 38. As shown in FIG. 3, the light emitting diode package 30 usually functions together with a reflector 42 in order to control the direction of the light beams for achieving satisfactory illumination. Preferably, the reflector 42 functions to reflect and straighten the light produced by the hemispherical lens 32 to form a virtually parallel light 44 before entering the light guide plate 38 and after a series of optical transformations, a uniform and flat light source is produced for the display.

A nearly parallel and uniform light 44 can be produced by combining the light emitting diode package 30 with the reflector 42. However, the light has to go through a series of medium conversions and after each conversion, and a part of the light will be absorbed by the medium in the form of energy and then transform the energy to heat energy in the medium. As a result, the illumination will be greatly decreased after going through numerous medium conversions.

Therefore, it has become a popular topic for the industries to develop a new light emitting diode package that does not only have a small divergent angle, but also qualifies the need for achieving high illumination efficiency without having to go through numerous medium conversion processes.

It is therefore an objective of the present invention to provide a light emitting diode package for solving the above-mentioned problems.

BRIEF SUMMARY OF THE INVENTION

An embodiment of a light emitting diode package in accordance with the present invention comprises a light emitting diode package and a lens encapsulating the light emitting diode package. The lens further comprises two reflective surfaces disposed at either side of a central axis, and a plurality of diffractive surfaces disposed between the reflective surfaces and each of the diffractive surfaces having a tilt angle respective to the central axis, in which portions of light beams incident to each of the reflective surfaces are reflected to at least one diffractive surface and then diffracted and collected into a convergent angle.

In contrast to the conventional light emitting diode package, an embodiment of a light emitting diode package in accordance with the present invention utilizes a semi vase-shaped lens to package a light emitting diode chip, in which the lens also includes both reflective surfaces and diffractive surfaces. After the light enters the reflective surface while the incident angle is greater than the critical angle, a total internal reflection is generated to inhibit the traveling direction of the light projected from the light emitting diode, in which the light has a great divergent angle. Next, the diffractive phenomenon generated when light projected to the diffractive surface is utilized to direct the light to a horizontal direction within ±25°, and at the same time, light also coming from the light emitting diode chip having smaller divergent angle is diffracted to a horizontal direction within ±25°. Consequently, an embodiment of a light emitting diode package in accordance with the present invention can be utilized as an excellent side illuminating light source for increasing the effectiveness of the illumination, in which the light projected from the light emitting diode chip can be guided only through the lens and air to the light guide plate, thereby by eliminating the need of going through any other medium conversions.

An embodiment of a light emitting diode package in accordance with the present invention, comprises, a light emitting diode device and a lens encapsulating the light emitting diode device. The lens further comprises two reflective surfaces disposed at either side of a central axis, and a plurality of diffractive surfaces disposed between the reflective surfaces, each of the diffractive surfaces having a tilt angle respective to the central axis, wherein portions of light beams incident to each of the reflective surfaces are reflected to at least one diffractive surface and then diffracted and collected into a convergent angle.

An embodiment of a backlight module in accordance with the present invention, comprises, a light guide plate, at least one optical film disposed above the light guide plate, and at least one illuminating device disposed in proximity to the side of the light guide plate. The illuminating device further comprises an illuminating semiconductor device and a lens disposed above the illuminating semiconductor device. The lens further comprises at least one reflective surface and at least one diffractive surface disposed in proximity to the reflective surface and the diffractive surface having a tilt angle respective to the central axis of the lens. A first portion of light beams is reflected by the reflective surface to the diffractive surface, diffracted by the diffractive surface, and collected into a convergent angle after the light produced by the illuminating semiconductor device enters the lens.

An embodiment of a flat panel display in accordance with the present invention, comprises, a display panel, a light guide plate disposed below the display panel, at least one optical film disposed between the display panel and the light guide plate, and at least one illuminating device disposed in proximity to the side of the light guide plate. The illuminating device further comprises an illuminating semiconductor device, and a lens disposed above the illuminating semiconductor device. The lens further comprises at least one reflective surface, and at least one diffractive surface disposed in proximity to the reflective surface and the diffractive surface having a tilt angle respective to the central axis of the lens. A first portion of light beams is reflected by the reflective surface to the diffractive surface, diffracted by the diffractive surface, and collected into a convergent angle after the light produced by the illuminating semiconductor device enters the lens.

A method for forming a flat panel display includes disposing a light guide plate below a display panel. At least one optical film is disposed between the display panel and the light guide plate. At least one illuminating device package is disposed in proximity to the side of the light guide plate. A method for forming the illuminating device package comprises forming a light emitting diode device over a substrate. A lens is formed to encapsulate the light emitting diode device. The lens includes two reflective surfaces disposed substantially symmetrically at either side of a central axis. The reflective surfaces are configured to reflect portions of light beams to at least one of the diffractive surfaces. A plurality of diffractive surfaces separate the reflective surfaces. The diffractive surfaces are configured to diffract the reflected light beams into a convergent angle. Each of the diffractive surfaces has a tilt angle respective to the central axis.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE INVENTION

Figure 1:
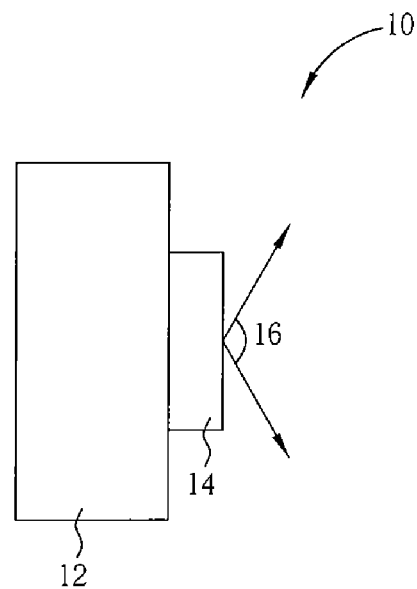
FIG. 1 is a perspective diagram showing a conventional light emitting diode package.
Figure 2:
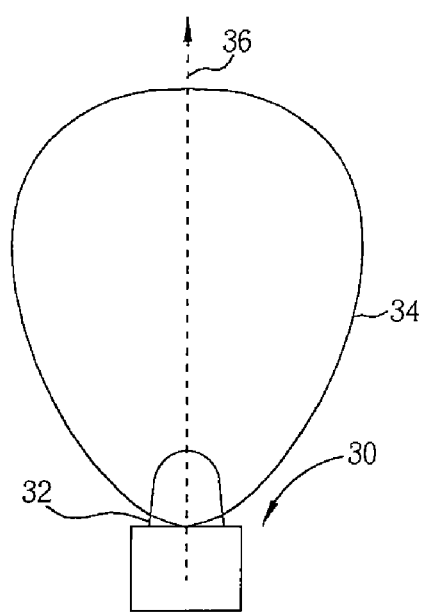
FIG. 2 is a perspective diagram showing another conventional light emitting diode package.
Figure 3:
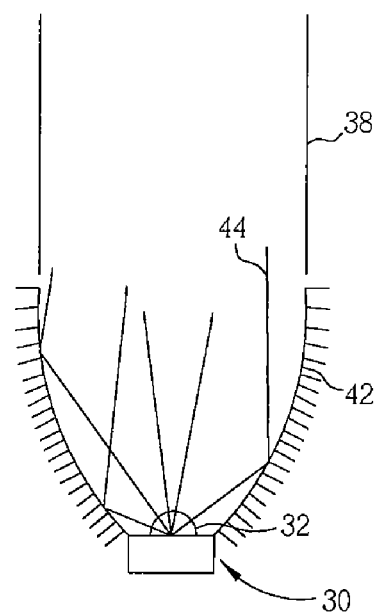
FIG. 3 is a perspective diagram showing the light emitting diode package from FIG. 2 disposed on the sideline of a light guide plate.
Figure 4:
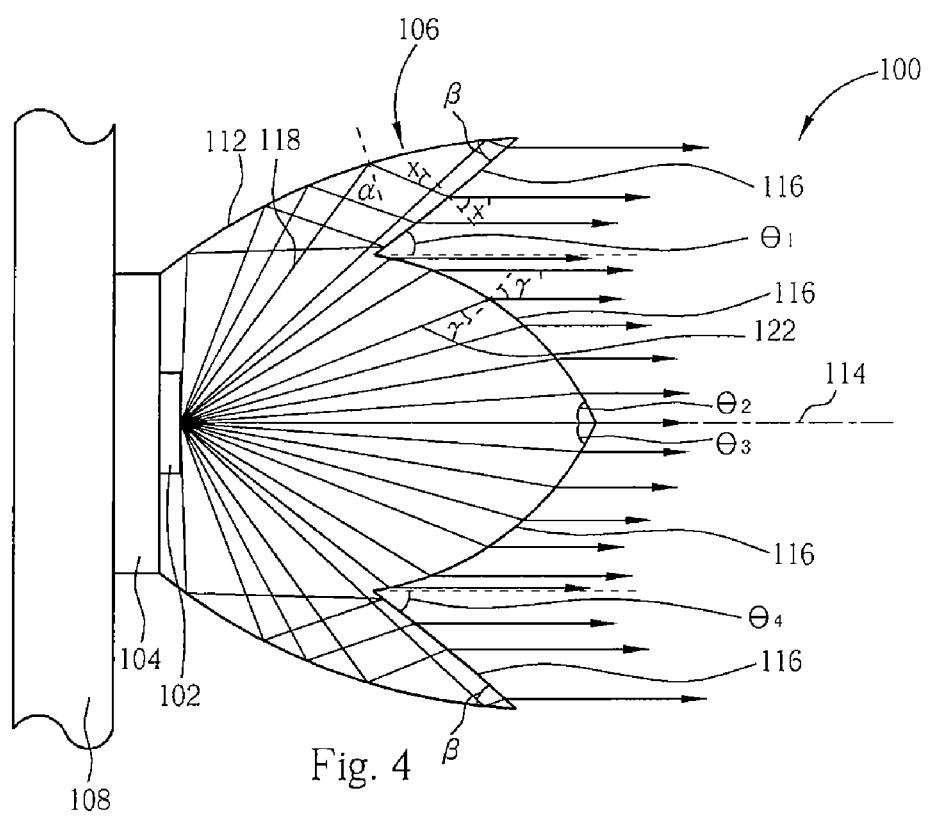
FIG. 4 and is a perspective diagram showing the cross-section of the light emitting diode package according to a first embodiment of the present invention.
Figure 5:
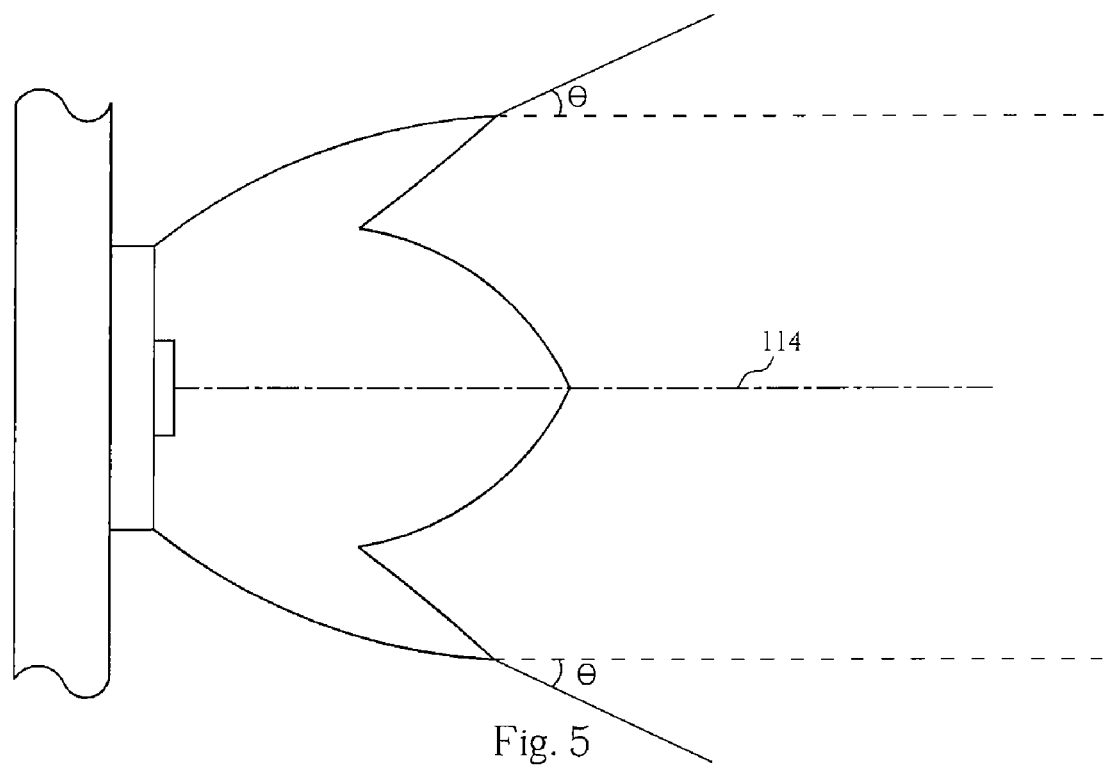
FIG. 5 is a perspective diagram showing the convergent angle of the light emitting diode package of FIG. 4.

FIG. 4 and is a perspective diagram showing the cross-section of the light emitting diode package 100 according to the first embodiment of the present invention, and FIG. 5 is a perspective diagram showing the convergent angle of the light emitting diode package 100 of FIG. 4. As shown in FIG. 4, the light emitting diode package 100 includes a light emitting diode chip 102, a packaging substrate 104 utilized for supporting the light emitting chip 102, a lens 106 for encapsulating the light emitting diode chip 102, and a circuit board 108. Fabricated by injection molding, the lens 106 is comprised of a polycarbonate (PC) lens, a polymethylmethacrylate (PMMA) lens, a resin lens, or a glass lens. Additionally, the lens 106 includes two reflective surfaces 112 disposed on two sides of a central axis 114 of the lens 106, in which each reflective surface 112 is disposed symmetrically to the central axis 114 and each reflective surface 112 includes a curved surface. The lens 106 also includes a plurality of diffractive surfaces 116 disposed between each of the reflective surfaces 112, in which a tilt angle (indicated by $\theta_1$, $\theta_2$, $\theta_3$, and $\theta_4$ in the figure) is formed between each diffractive surface 116 and the central axis 114.

In general, the flow of an electrical current from a circuit board 108 through the light emitting diode 102 to the PN junction will facilitate the electrons to combine with electron holes to produce light 118 and 122. Since the light 118 and 122 is projected to different directions, a portion of the light 118 (with a divergent angle greater than 40-50° of the light) is projected to the two reflective surfaces 112. Since the lens 106 is a denser medium than air, the diffractive coefficient $N_1$ of the lens 106 should be greater than the diffractive coefficient $N_2$ of air. Consequently, when the light 118 projects to the incident angle α of the reflective surface 112 matches a condition of "sin α≧$N_2$/$N_1$", then the light 118 will generate a total internal reflection on the two reflective surfaces 112 separately and reflect to at least one diffractive surface 116.

After the light 118 reaches each diffractive surface 116, an incident angle χ will be generated and at the same time, a diffractive phenomenon will also result on the diffractive surface 116 and the surface of the air. In other words, the light 118 will enter the diffractive surface 116 at the incident angle χ, its traveling path will deviate from the normal of the diffractive surface 116, and the light 118 will exit the diffractive surface 116 at a diffractive angle χ'.

The relationship between the incident angle χ and the diffractive angle χ' is as follows:

$$N_1/N_2 = \sin \chi'/\sin \chi$$

Since the diffractive coefficient $N_1$ is greater than the diffractive coefficient $N_2$, the diffractive angle χ' will also be greater than the incident angle χ. Therefore, after a series of total internal reflection and diffraction phenomenon, the diverged light 118 will be collected into a convergent angle θ and the convergent angle will form a ±25° angle respective to the central axis 114. (Please refer to FIG. 5)

On the other hand, since the light 122 projected from the light emitting diode chip 102 includes a smaller divergent angle, the light 122 will be directly projected into at least a diffractive surface 116 thereby generating a diffractive phenomenon, as shown in FIG. 4. In other words, the light 122 will enter the diffractive surface 116 at the incident angle γ, its traveling path will deviate from the normal of the diffractive surface 116, and the light will exit the diffractive surface 116 as a diffractive angle γ'.

The relationship between the incident angle γ and the diffractive angle γ is as follows:

$$N_1/N_2 = \sin \gamma'/\sin \gamma$$

Since the diffractive coefficient $N_1$ is greater than the diffractive coefficient $N_2$, the diffractive angle γ' will also be greater than the incident angle γ. Eventually, the light 122 will be collected into the convergent angle θ. (Please refer to FIG. 5)

According to the lens 106 of the present invention, a total internal reflection phenomenon generated by utilizing the light 118 to enter the reflective surface 112, in which the incident angle α is greater than the critical angle, is utilized to inhibit the traveling direction of the light 118 projected from the light emitting diode chip 102, in which the light 118 includes a great divergent angle. Next, the light 118 is entered into the diffractive surface 116 to generate a diffractive phenomenon for re-directing the light 118 to a horizontal direction within ±25°. At the same time, the light 122 with the smaller divergent angle, which has also been projected from the light emitting diode chip 102, is diffracted directly to the horizontal direction within ±25°. Consequently, the light emitting diode package 100 becomes a package that is able to "project light from the sides" and by combining the light source with the module structure, the light 118 and 122 projected from the light emitting diode 102 can be directed to a light guide plate by just going through the lens 106 and air and without having to go through any other medium conversions, thereby greatly improving the illumination efficiency and reducing the need of utilizing auxiliary devices.

According to the mechanisms described previously, the light emitting diode package 100 of the present invention includes the following key characteristics: First, the design of each reflective surface 112 has to allow the light 118 with the bigger divergent angle emitted from the light emitting diode chip 102 to generate a total internal reflection, and secondly, the design of each diffractive surface 116 has to allow the light 118 and 122 to generate an appropriate amount of deviation during diffraction, thereby successfully collecting the light into the convergent angle θ. As shown in FIG. 4, since each reflective surface 112 is represented by a curving surface, the first characteristic can be achieved by controlling the curvature of each reflective surface 112 and the material of the lens 106 (meaning to control the diffractive coefficient of the lens), whereas the second characteristic can be achieved by controlling the tilt angle between the each diffractive surface 116 and the central axis 114 and the material of the lens 106. As shown in FIG. 4, an example is provided by forming an acute angle β with two diffractive surfaces 116 and each reflective surface 112, and a triangular surface is formed by the rest of the diffractive surfaces 116.

Figure 6:
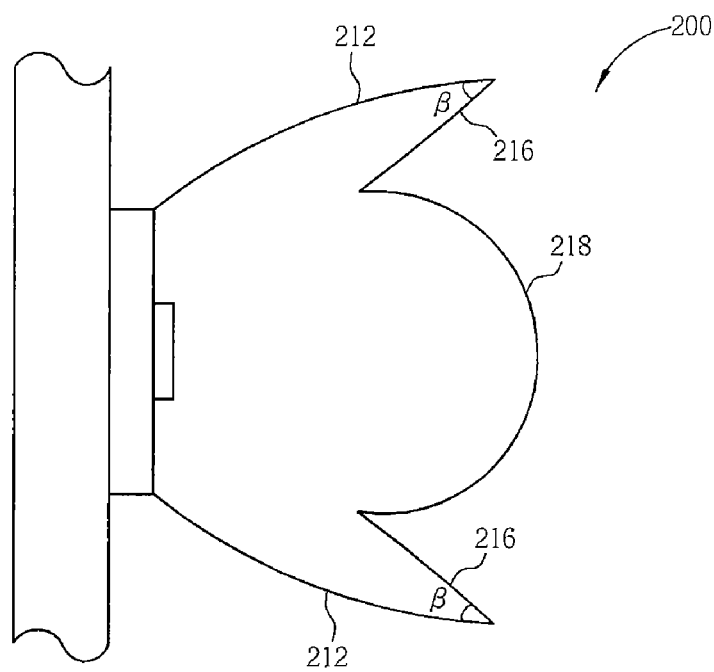
FIG. 6 is a perspective diagram showing the cross-section of the light emitting diode package according to a second embodiment of the present invention.
Figure 7:
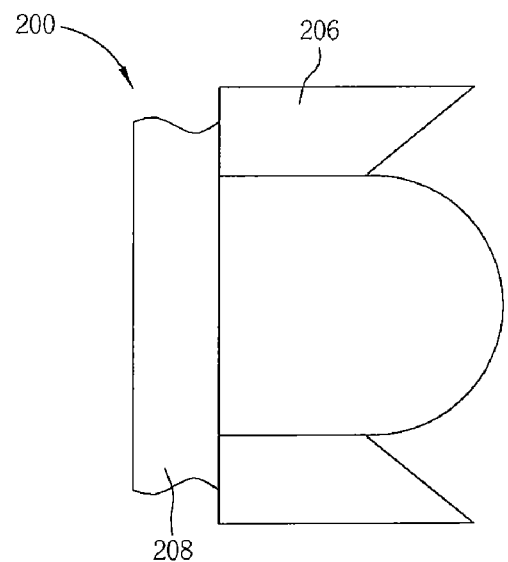
FIG. 7 is a perspective diagram showing the external view of the light emitting diode package from FIG. 6.

Alternatively, a total internal reflection can be achieved by applying a suitable reflective material over the surface and each diffractive surface can also be manipulated by other methods. Please refer to FIG. 6. FIG. 6 is a perspective diagram showing the cross-section of the light emitting diode package 200 according to the second embodiment of the present invention. As shown in FIG. 6, each of the two diffractive surfaces 216 forms an acute angle β with each reflective surface 212 separately whereas the rest of the diffractive surfaces form a hemispherical surface 218. Please refer to FIG. 7. FIG. 7 is a perspective diagram showing the external view of the light emitting diode package 200 from FIG. 6. As shown in FIG. 7, the light emitting diode package 200 is in fact a semi-vase-shaped structure, in which the structure includes a circuit board 208, a lens 206, a light emitting diode chip and a packaging substrate for supporting the light emitting diode chip, similar to the ones shown in FIG. 4.

Additionally, each reflective surface does not have to be disposed symmetrically on the two sides of the central axis, but can also have other variations, and the two diffractive surfaces connected to each reflective surface may also form different acute angles with other reflective surfaces. Essentially, variations related to the two characteristics described are all included within the present invention.

Figure 8:
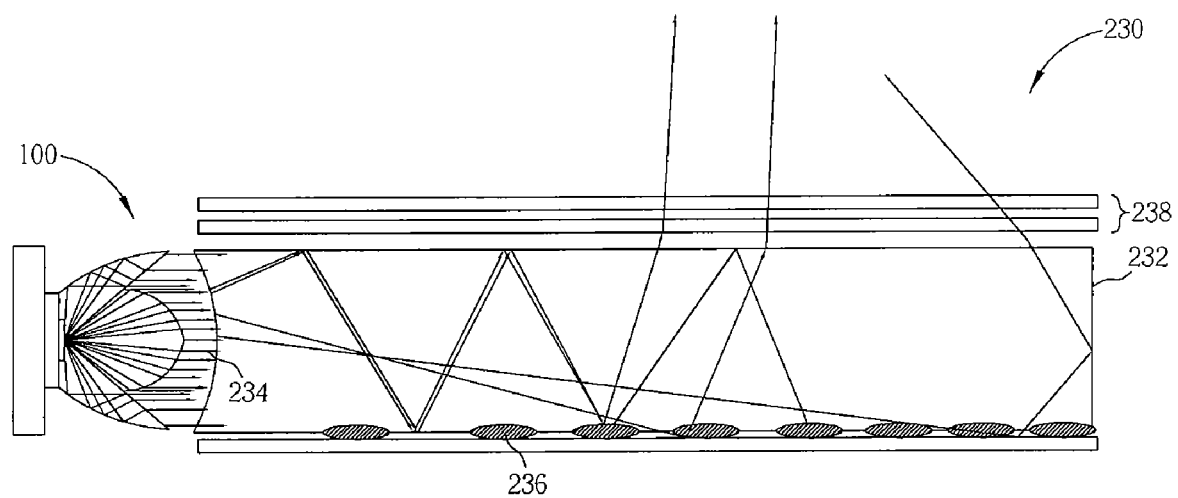
FIG. 8 is a perspective diagram showing combination of the light emitting diode package with another backlight module according to one embodiment of the present invention.

FIG. 8 is a perspective diagram showing combination of the light emitting diode package 100 with a backlight module 230. As shown in FIG. 8, the light emitting diode package 100 is disposed on the side of a light guide plate 232 of the backlight module 230 and due to the small divergent angle (±25°), almost all the light 234 is directed into the light guide plate 232 after the light 234 is projected from the light emitting diode package 100. Next, the light 234 is reflected upward via the diffusion point 236 located on the bottom of the light guide plate 232 and then directed to a display through an optical mechanism 238 composed of controlling sheets and thin film materials, in which the optical mechanism 238 can be a diffusion plate or a prism.

Figure 9:
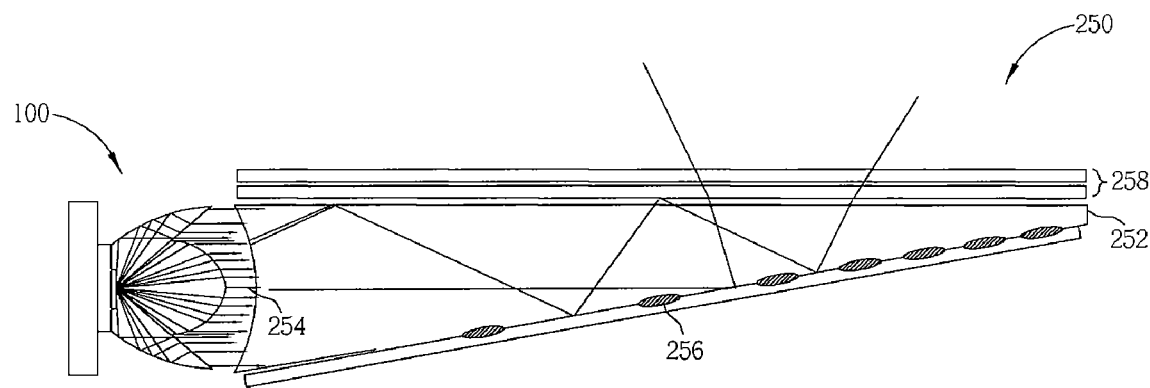
FIG. 9 is a perspective diagram showing combination of the light emitting diode package with another backlight module according to another embodiment of the present invention.

FIG. 9 is a perspective diagram showing combination of the light emitting diode package 100 with a backlight module 250. As shown in FIG. 9, the light emitting diode package 100 is disposed on the side of a light guide plate 252 of the backlight module 250, in which the light guide plate 252 is a wedge shaped light guide plate. Similarly, due to the small divergent angle (±25°), almost all the light 254 is directed into the light guide plate 252 after the light 254 is projected from the light emitting diode package 100. Next, the light 254 is reflected upward via the structure of the light guide plate 252 and the diffusion point 256 located on the bottom of the light guide plate 252 and then directed to a display through an optical mechanism 258 composed of controlling sheets and thin film materials, in which the optical mechanism 258 can be a diffusion plate or a prism.

Figure 10:
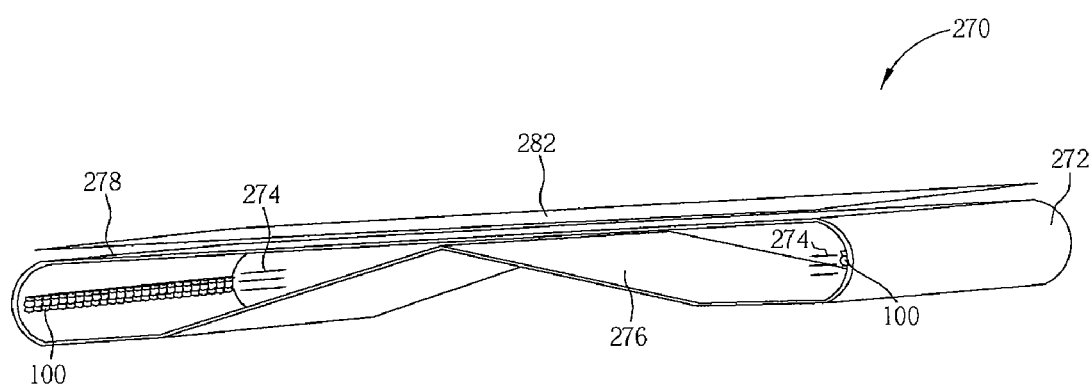
FIG. 10 is a perspective diagram showing combination of the light emitting diode package with another backlight module according to still another embodiment of the present invention.

FIG. 10 is a perspective diagram showing combination of the light emitting diode package 100 with a backlight module 270, and in order to clearly demonstrate the relationship between each component, FIG. 10 is shown from a 3-D perspective. As shown in FIG. 10, a plurality of light emitting diode packages 100 are disposed on two sides of a light guide plate 272, in which the light guide plate 272 is a double wedge-shaped light guide plate. Similarly, due to the small divergent angle (±25°), almost all the light 274 is directed into the light guide plate 272 after the light 274 is projected from the light emitting diode packages 100. Next, the light 274 is reflected upward via the diffusion point 276 located on the bottom of the light guide plate 272 and then directed to a display through an optical mechanism 278 composed of controlling sheets and thin film materials.

Figure 11:
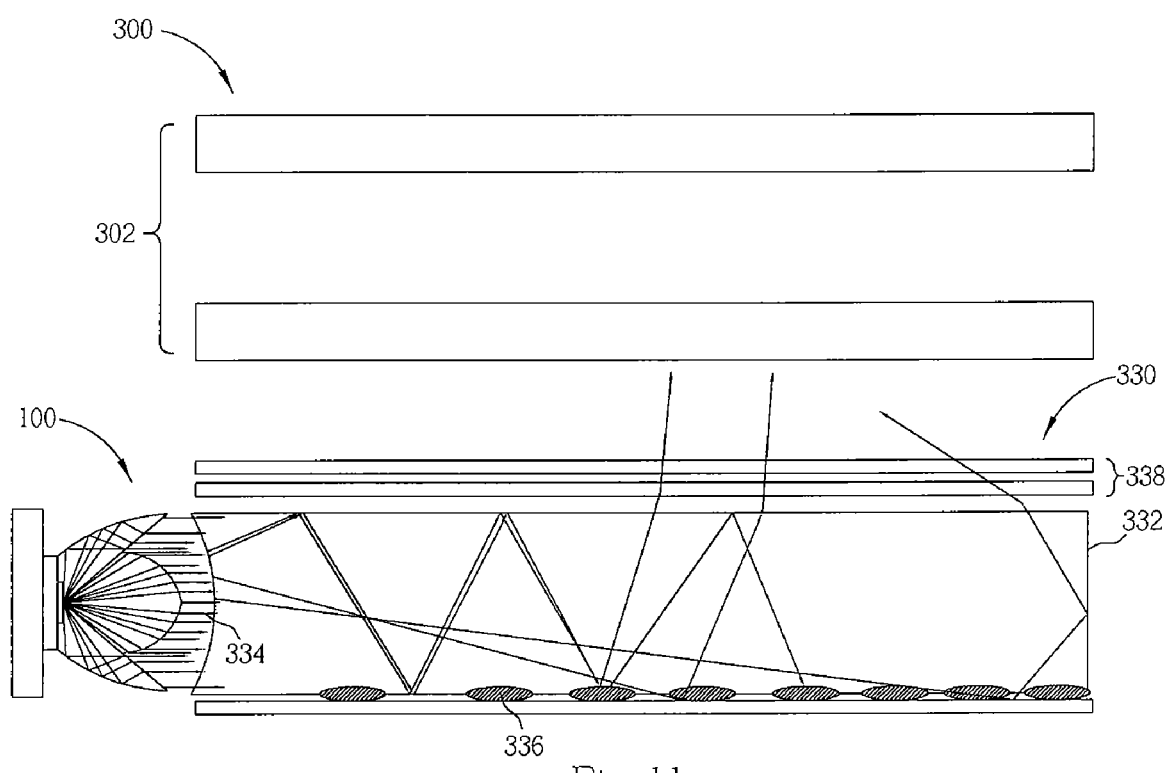
FIG. 11 is a perspective diagram showing application of the light emitting diode package to a flat panel display according to yet another embodiment of the present invention.

FIG. 11 is a perspective diagram showing application of the light emitting diode package 100 to a flat panel display 300. As shown in FIG. 11, the flat panel display 300 includes display panel 302 and a backlight module 330, in which the backlight module 330 is disposed below the display panel 302. The backlight module 330 also includes a light guide plate 332 therein and the light emitting diode package 100 of the present invention is disposed on the side of the light guide plate 332. Similar to the previous embodiments, due to the small divergent angle (±25°), almost all the light 334 is directed into the light guide plate 332 after the light 334 is projected from the light emitting diode package 100. Next, the light 334 is reflected upward via the diffusion point 336 located on the bottom of the light guide plate 332 and then directed to the display panel 302 through an optical mechanism 338 composed of controlling sheets and thin film materials, in which the optical mechanism 338 can be a diffusion plate or a prism.

By utilizing a semi-vase-shaped lens to package a light emitting diode chip, in which the lens also includes both reflective surface and diffractive surface, the light entering the reflective surface is able to generate a total internal reflection phenomenon for inhibiting the traveling direction of the light having a great divergent angle, which has been projected from the light emitting diode chip, and the diffractive surface is able to direct the light to a horizontal direction within ±25°. Essentially, the light emitting diode package of the present invention is not only able to provide an excellent side illumination characteristic, but also able to eliminate the process of going through numerous medium conversions to direct light to the light guide plate. As a result, the light emitting diode package of the present invention can be utilized as a side-illuminating light source device for fabricating display products with much lower costs, simpler structures, and better yield.

In contrast to the conventional light emitting diode package, the light emitting diode package of the present invention utilizes a semi-vase-shaped lens to package a light emitting diode chip, in which the lens also includes both reflective surfaces and diffractive surfaces. After the light enters the reflective surface while the incident angle is greater than the critical angle, a total internal reflection is generated to inhibit the traveling direction of the light projected from the light emitting diode, in which the light has a great divergent angle. Next, the diffractive phenomenon generated when light is projected to the diffractive surface is utilized to direct the light to a horizontal direction within ±25°, and at the same time, light also coming from the light emitting diode chip having smaller divergent angle is diffracted directly to a horizontal direction within ±25°. Consequently, the light emitting diode package of the present invention can be utilized as an excellent side illuminating light source for increasing the effectiveness of the illumination, in which the light projected from the light emitting diode chip can be guided only through the lens and air to the light guide plate, thereby by eliminating the need of going through any other medium conversion processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flat panel display comprising:
   a display panel;
   a light guide plate disposed below the display panel;
   at least one optical film disposed between the display panel and the light guide plate; and
   at least one illuminating device package disposed in proximity to the side of the light guide plate, wherein each illuminating device package includes:
   an illuminating semiconductor device, and
   a lens encapsulating the illuminating semiconductor device, wherein the lens comprises,
      two reflective surfaces disposed at either side of a central axis, and
      a plurality of diffractive surfaces disposed between the reflective surfaces, each of the diffractive surfaces having a tilt angle respective to the central axis, wherein a first portion of light beams incident to each of the reflective surfaces is reflected to at least one diffractive surface and then diffracted and collected into a first convergent angle.

2. The flat panel display of claim 1, wherein a second portion of the light beams is projected directly to the at least one diffractive surface, diffracted by the at least one diffractive surface, and collected into a second convergent angle after the light produced by the illuminating semiconductor device enters the lens.

3. The flat panel display of claim 1, wherein the lens comprises a polycarbonate (PC) lens, a polymethylmethacrylate (PMMA) lens, a resin lens, or a glass lens.

4. The flat panel display of claim 1, wherein the at least one optical film is a diffuser plate.

5. The flat panel display of claim 1, wherein the at least one optical film is a prism.

6. The flat panel display of claim 1, wherein the reflective surfaces are disposed symmetrically on both sides of the central axis.

7. The flat panel display of claim 1, wherein the first portion of the light beams incident to each of the reflective surfaces is reflected to the at least one diffractive surface after each reflective surface generates a total internal reflection.

8. The flat panel display of claim 1, wherein at least two diffractive surfaces are disposed symmetrically on both sides of the central axis.

9. The flat panel display of claim 1, wherein two of the diffractive surfaces form an acute angle respective to each reflective surface and the remaining diffractive surfaces form a hemispherical surface.

10. The flat panel display of claim 1, wherein two of the diffractive surfaces form an acute angle respective to each reflective surface and the remaining diffractive surfaces form a triangular surface.

11. The flat panel display of claim 1, wherein the light beams from the illuminating semiconductor device directly projected to the at least one diffractive surface is diffracted by the at least one diffractive surface and collected to the first convergent angle.

12. The flat panel display of claim 1, wherein the at least one diffractive surface is configured to diffract the reflected light beams such that the diffracted light beams are substantially parallel to the central axis.

13. The flat panel display of claim 1, wherein the first convergent angle with respect to the central axis is between about +25 degrees and about −25 degrees.

14. The flat panel display of claim 1, wherein the reflective surfaces disposed at either side of the central axis are separated.

15. The flat panel display of claim 1, wherein a first diffractive surface contacts a first reflective surface to form a first acute angle, a second diffractive surface contacts a second reflective surface to form a second acute angle, and at least one third diffractive surface extends from the first diffractive surface to the second diffractive surface to form a hemispherical surface.

16. The flat panel display of claim 1, wherein a first diffractive surface contacts a first reflective surface to form a first acute angle, a second diffractive surface contacts a second reflective surface to form a second acute angle, and at least third one diffractive surface extends from the first diffractive surface to the second diffractive surface to form a triangular surface.

17. The flat panel display of claim 1, wherein a first diffractive surface contacts a first reflective surface to form a first acute angle, a second diffractive surface contacts a second reflective surface to form a second acute angle, and at least one third diffractive surface extends from the first diffractive surface to the second diffractive surface to form a semi-vase-shaped surface.

18. The flat panel display of claim 1, wherein a first diffractive surface contacts a first reflective surface to form a first acute angle, a second diffractive surface contacts a second reflective surface to form a second acute angle, a third diffractive surface contacts the first diffractive surface to form a third acute angle, and a fourth diffractive surface contacts the second diffractive surface to form a fourth acute angle.

* * * * *